(12) United States Patent
Madhavan et al.

(10) Patent No.: US 11,043,262 B2
(45) Date of Patent: Jun. 22, 2021

(54) WRITE ASSIST CIRCUITRY

(71) Applicant: Arm Limited, Cambridge (GB)

(72) Inventors: Arjunesh Namboothiri Madhavan, Bangalore (IN); Akash Bangalore Srinivasa, Bangalore (IN); Sujit Kumar Rout, Bangalore (IN); Vikash, Bangalore (IN); Gaurav Rattan Singla, San Jose, CA (US); Vivek Nautiyal, Milpitas, CA (US); Shri Sagar Dwivedi, San Jose, CA (US); Jitendra Dasani, Cupertino, CA (US); Lalit Gupta, Cupertino, CA (US)

(73) Assignee: Arm Limited, Cambridge (GB)

( * ) Notice: Subject to any disclaimer, the term of this patent is extended or adjusted under 35 U.S.C. 154(b) by 26 days.

(21) Appl. No.: 15/886,630

(22) Filed: Feb. 1, 2018

(65) Prior Publication Data
US 2019/0237135 A1 Aug. 1, 2019

(51) Int. Cl.
| | |
|---|---|
| *G11C 11/419* | (2006.01) |
| *H01L 29/94* | (2006.01) |
| *H01L 27/11* | (2006.01) |
| *G11C 7/10* | (2006.01) |
| *G11C 7/18* | (2006.01) |
| *G11C 8/16* | (2006.01) |
| *G11C 7/12* | (2006.01) |

(52) U.S. Cl.
CPC .......... *G11C 11/419* (2013.01); *G11C 7/1096* (2013.01); *G11C 7/12* (2013.01); *G11C 7/18* (2013.01); *G11C 8/16* (2013.01); *H01L 27/1116* (2013.01); *H01L 29/94* (2013.01)

(58) Field of Classification Search
CPC .......... G11C 11/419; G11C 7/12; G11C 8/16; G11C 7/18; G11C 7/1096; H01L 27/1116; H01L 29/94
See application file for complete search history.

(56) References Cited

U.S. PATENT DOCUMENTS

| | | | | |
|---|---|---|---|---|
| 5,862,089 | A * | 1/1999 | Raad | G11C 11/4074 365/203 |
| 2011/0051489 | A1* | 3/2011 | Kuroda | G11C 8/16 365/72 |
| 2012/0014172 | A1* | 1/2012 | Jung | G11C 11/413 365/154 |
| 2012/0170388 | A1* | 7/2012 | Choi | G11C 11/413 365/189.16 |
| 2015/0131368 | A1* | 5/2015 | Adams | G11C 11/419 365/156 |

(Continued)

*Primary Examiner* — Khamdan N. Alrobaie
(74) *Attorney, Agent, or Firm* — Pramudji Law Group PLLC; Ari Pramudji

(57) ABSTRACT

Various implementations described herein are directed to an integrated circuit having memory circuitry with an array of bitcells. The integrated circuit may include read-write circuitry that is coupled to the memory circuitry to perform read operations and write operations for the array of bitcells. The integrated circuit may include write assist circuitry that is coupled to the memory circuitry and the read-write circuitry. The write assist circuitry may receive a control signal from the read-write circuitry. Further, the write assist circuitry may sense write operations based on the control signal and may drive the write operations for the array of bitcells.

20 Claims, 8 Drawing Sheets

(56) References Cited

U.S. PATENT DOCUMENTS

| | | | |
|---|---|---|---|
| 2015/0170721 A1* | 6/2015 | Dubey | G11C 7/12 |
| | | | 365/189.16 |
| 2015/0255148 A1* | 9/2015 | Roy | G11C 11/4096 |
| | | | 365/154 |
| 2016/0196868 A1* | 7/2016 | Huang | G11C 11/419 |
| | | | 365/72 |
| 2016/0240245 A1* | 8/2016 | Yang | H01L 27/1116 |
| 2018/0294018 A1* | 10/2018 | Baeck | G11C 7/1096 |

* cited by examiner

WRITE ASSIST CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, there may be a voltage drop in signals, such as bitline signals, due to high metal resistance. Thus, in some situations, bitcell write delay may be much less for cells disposed near a bitline driver as compared to another bitcell that is disposed farther from the bitline driver. Conventionally, bitline discharge is typically achieved from one direction, such as from the bitline driver side. This may limit cycle time of memory, and this may also cause write failure at high voltage corners. Sometimes, this scenario may further cause an increase in bitline precharge delay.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to write assist circuitry including methods and circuitry for cycle time improvement by reducing write delay. For instance, some implementations described herein are related to drive the bitline from both directions to reduce the bitline resistance-capacitance (RC) delay while writing the bitcell and precharging the bitline. The write assist circuitry (which may be referred to as write amplifier circuitry) may be able to sense and amplify a write operation taking place while a write is activated or enabled. The write amplifier circuitry may not embody a full write driver. The write assist circuitry (or write amplifier circuitry) may include a write driver at both ends of a bitline, which may overcome write challenges due to high metal resistance caused by having only one write driver at one end of the bitline. Therefore, in this instance, by adding write assist circuitry at the other end of the bitline may assist and speed up the write operation. The write assist circuitry may also be activated or enabled by one or more control signals that sense when a write operation is taking place.

Accordingly, implementations described herein are associated with discharging bitlines from both directions (e.g., top and bottom) to reduce bitline RC delay during write operations. Advantageously, there may be no area impact by introducing the write assist circuitry, and there may be no critical dependency of other signals on bitline timing, which may affect margin. These features are described in greater detail herein below.

Further, various implementations described herein are related to a High-Speed Differential Split Driver with Write Assist (HSDSD-WA). As such, some implementations, described herein provide an architecture and/or scheme having a column wise differential split write driver with an equalizer to improve bitcell write time while improving static write margin of a bitcell by supporting write operations on a highly resistive bitline environment. The architecture and/or scheme may also improve write time and yield under reverse write (read before write) condition where a core voltage (vddce) may be higher than a periphery voltage (vddpe).

Various implementations of read assist circuitry will be described in detail herein with reference to FIGS. 1-6B.

Figure 1:
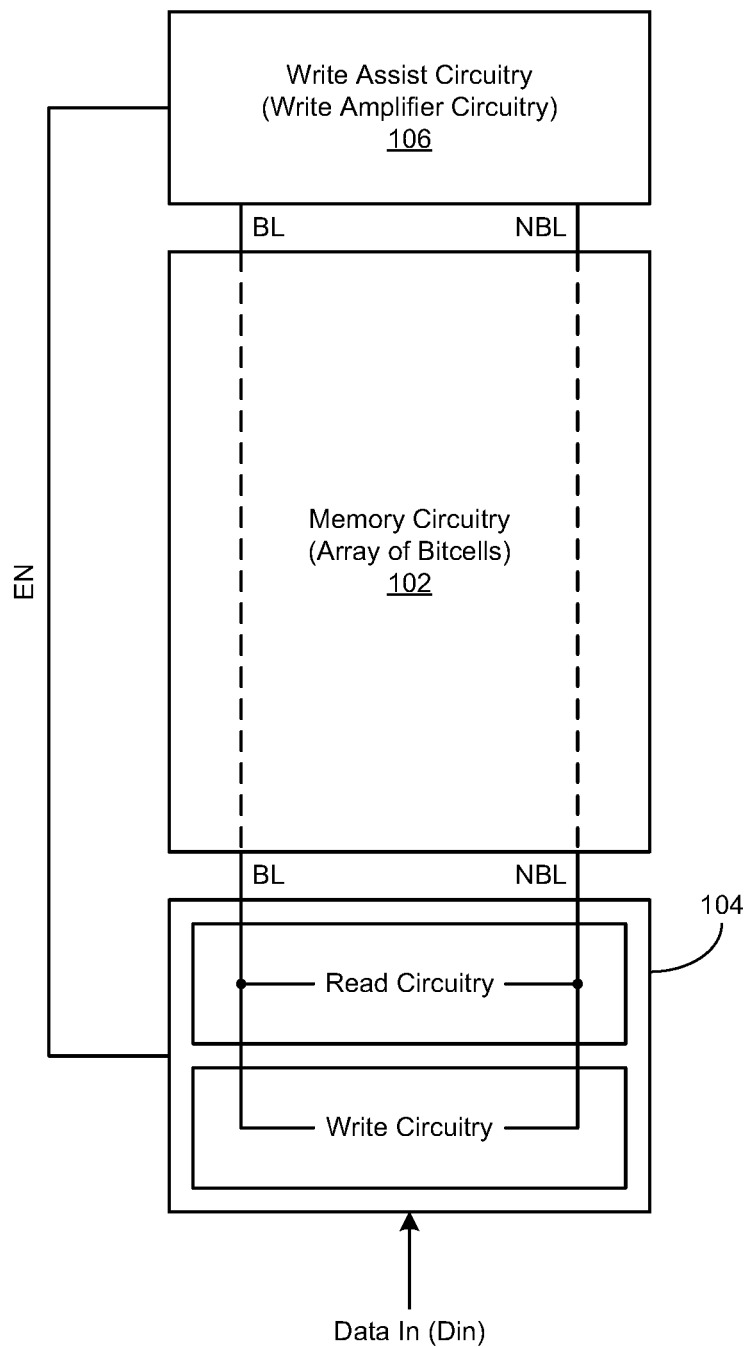
FIG. 1 illustrates a block diagram of a memory component in accordance with various implementations described herein.

FIG. 1 illustrates a block diagram of a memory component 100 in accordance with various implementations described herein.

The memory component 100 may be implemented as an integrated circuit (IC) in using various types of memory, such as, e.g., random access memory (RAM), including static RAM (SRAM), and/or any other types of volatile memory. In some implementations, the memory component 100 may be implemented as an IC with dual rail memory architecture and related circuitry. In some other implementations, the memory component 100 may be integrated with computing circuitry and related components on a single chip. Further, the memory component 100 may be implemented in an embedded system for various electronic and mobile applications, including low power sensor nodes.

As shown in FIG. 1, the memory component 100 includes memory circuitry 102 having an array of memory cells, wherein each memory cell may be referred to as a bitcell. Further, each memory cell may be configured to store at least one data bit value (e.g., a data value related to a logical '0' or '1'). In various instances, the array of memory cells may include any number of memory cells arranged in various configurations, such as, e.g., a two-dimensional (2D) memory array having columns and rows of multiple memory cells arranged in a 2D grid pattern with 2D indexing capabilities.

In some cases, each memory cell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. Further, the memory circuitry 102 may operate at a source voltage level VDD with a voltage range that varies with technology. As described herein, before a read operation, charge may be shared with the bitline BL, NBL for pre-charging the bitline BL, NBL to a voltage value of VDD-x, e.g., where x is around ~100 mV.

The memory component 100 may include read-write circuitry 104 coupled to the memory circuitry 102 to perform read operations and write operations for the array of bitcells. The read-write circuitry 104 may receive a data input signal (Din) and perform the read operations and the write operations for the array of bitcells based on the data input signal (Din). In various instances, the data input signal (Din) may include multiple input signals, which is described in greater detail herein below. The read-write circuitry 104 may be coupled to the memory circuitry 102 via multiple bitlines (BL, NBL). The read-write circuitry 104 may be coupled to the memory circuitry 102 via the multiple bitlines (BL, NBL) so as to perform the read operations and the write operations for the array of bitcells via the multiple bitlines (BL, NBL).

The memory component 100 may include write assist circuitry 106, which is coupled to the memory circuitry 102 and the read-write circuitry 104. The write assist circuitry 106 may be coupled to the memory circuitry 102 via the multiple bitlines (BL, NBL) so as to drive the write operations for the array of bitcells via the multiple bitlines (BL, NBL). In some implementations, the bitlines (BL, NBL) may include a first bitline BL and a second bitline NBL that is complementary to the first bitline BL.

Further, the read-write circuitry 104 may drive the write operations via the multiple bitlines (BL, NBL) from a first direction (e.g., from the bottom of the memory circuitry 102), and the write assist circuitry 106 may drive the write operations via the multiple bitlines (BL, NBL) from a second direction that is different than the first direction. In some cases, the first direction may be from the bottom of the memory circuitry 102, and the second direction may be from the top of the memory circuitry 102, which is opposite of the bottom of the memory circuitry 102. In some implementations, the first direction and the second direction may be reversed, i.e., the first direction may be from the top of the memory circuitry 102 and the second direction may be from the bottom of the memory circuitry 102.

In some implementations, the read-write circuitry 104 may include a logic circuit that may receive multiple input signals (including one or more data input signals (Din)) and may provide a control signal (or an activation signal or an enable signal EN) based on the multiple input signals. The logic circuit may include multiple logic gates that may be arranged to receive the multiple input signals including a column select signal (YW), a write clock signal (WCLK), and/or a write enable signal (WEN) and may provide the enable signal EN based on the multiple input signals. Further description related to read-write circuitry 104 and/or the logic circuitry are described in greater detail herein below.

The write assist circuitry 106 may receive the control signal (or enable signal EN) from the read-write circuitry 104, and the write assist circuitry 106 may write operations based on the enable signal EN and drive the write operations for the array of bitcells. Operational combination of the read-write circuitry 104 and the write assist circuitry 106 may provide for discharging the multiple bitlines (BL, NBL) in the first direction and the second direction so as to reduce resistance-capacitance delay on the multiple bitlines during the write operations.

In some implementations, the write assist circuitry 106 may include one or more transistors that are arranged to receive the enable signal EN and drive the write operations for the array of bitcells by discharging the multiple bitlines (BL, NBL). Further, the write assist circuitry 106 may include differential split write driver assist circuitry having one or more transistors and one or more logic gates that are arranged to receive the enable signal EN and drive the write operations for the array of bitcells. Further, in some cases, the one or more transistors may include cross-coupled differential transistors that are arranged to sense write operations based on the enable signal EN. Further description related to write assist circuitry 106 and various components associated therewith are described in greater detail herein below.

Figure 2:
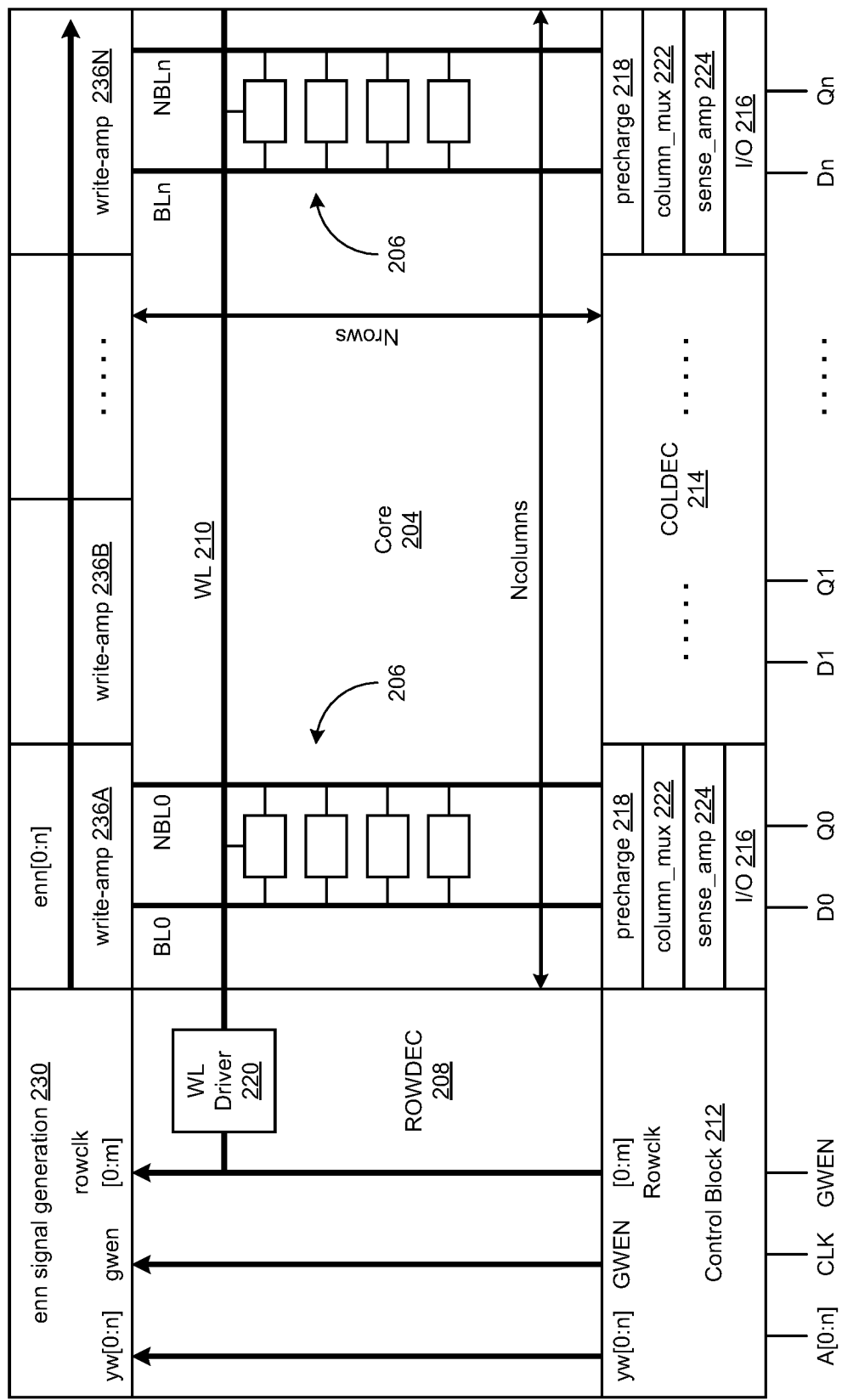
FIG. 2 illustrates a diagram of memory circuitry in accordance with various implementations described herein.

FIG. 2 illustrates a block diagram of memory circuitry 200 in accordance with various implementations described herein.

As shown in FIG. 2, the memory circuitry 200 may include a core 204 with an array of memory cells 206 arranged in rows and columns. The memory circuitry 200 may include a row decoder 208 (ROWDEC) that accesses each of the memory cells 206 via a selected wordline (WL) 210 that is driven by wordline driver 220. In some cases, the memory circuitry 200 (including the core 204, the memory cells 206, and the row decoder 208) may operate at a first supply voltage, such as, e.g., a core supply voltage VDDC. The voltage range varies with technology. In some cases, the row decoder 208 may operate at the core supply voltage VDDC, and other components, such as, e.g., the write driver 220 may generate a write (WR) driver signal at a second supply voltage that may be different than the first or core supply voltage VDDC, such as, e.g., a periphery supply voltage VDDP.

As shown in FIG. 2, the core 204 may include the array of memory cells 206, and each memory cell 206 may be referred to as a bitcell. Further, each memory cell 206 may be configured to store at least one data bit value (e.g., a data value associated with logical '0' or '1'). In various implementations, the array of memory cells 206 may include any number of memory cells or bitcells arranged in various configurations, such as, e.g., a two-dimensional (2D) memory array having columns (Ncolumns) and rows (Nrows) of multiple memory cells arranged in a 2D grid pattern with 2D indexing capabilities.

The memory circuitry 200 may be implemented as an integrated circuit (IC) for various types of memory, such as, e.g., random access memory (RAM), and/or any other types of memory, including any type of volatile and non-volatile memory. In some cases, each memory cell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

The memory circuitry 200 may include periphery circuitry having a control block 212 and a column decoder 214 (COLDEC) with input/output (I/O) circuitry 216 that accesses each of the memory cells 206 via a selected bitline BL, . . . , BLn. The selected bitline BL, . . . , BLn may include a selected pair of complementary bitlines BL/NBL, . . . , BLn/NBLn. Further, the periphery circuitry may include the row decoder (ROWDEC) 208 coupled to the write driver 220 and the column decoder (COLDEC) 214 to select a bitcell in the array of memory cells 206 (or bitcells) with the wordline (WL) signal and the bitline (BL) signal. The periphery circuitry may operate at the second or periphery supply voltage VDDP, that is different than the first or core supply voltage VDDC. The voltage range varies with technology. In some instances, the column decoder 214 may operate at the periphery supply voltage VDDP, and the write driver 220 may generate a bitline pulldown signal at the periphery supply voltage VDDP. The column decoder (COLDEC) 214 and/or components associated therewith (e.g., 216, 218, 222, 224) may receive data signals (D0, D1, . . . , Dn) and one or more other I/O signals (Q0, Q1, . . . , Qn).

The write driver 220 may receive one or more control signals, such as, e.g., row clock signal (Rowclk) via the control block 212. The I/O circuitry 216 may include bitline precharge circuitry 218 that may be used to precharge the bitlines BL/NBL, . . . , BLn/NBLn. Further, the I/O circuitry 216 may include a column multiplexer 222 and a sense amplifier 224. During a write cycle, the write driver 220 may write data to the selected memory cell (or bitcell) via the selected wordline (WL) 210 and the selected bitline (BLn/NBLn).

As shown in FIG. 2, the periphery circuitry may further include control signal generation circuitry 230, which may be referred to as enn signal generation circuitry. The control block 212 receives one or more control signal, such as, e.g., an address signal A[0:n], a clock signal CLK, and a global write enable signal GWEN and provides those control signals to the control (enn) signal generation circuitry 230 via the row decoder (ROWDEC) 208. The control (enn) signal generation circuitry 230 receives the control signals A[0:n], CLK, GWEN and provides a control signal enn[0:n] to one or more write amplifiers 236A, 236B, . . . , 236N, which may be referred to as write assist circuitry. In some implementations, memory operations may be determined by the control signal (enn), wherein a data logic value of '0' (zero) may provide for a read operation to be performed, and a data logic value of '1' (one) may provide for a write operation to be performed. The write amplifier circuitry 236A, 236B, . . . , 236N (or write assist circuitry) may operate in accordance with various implementations as described in greater detail herein.

In some implementations, the various implementations described herein are directed to the write amplifier (write assist) circuitry 236A, 236B, . . . , 236N that is disposed at the top of memory core 204, so as to assist with discharging the bitline from both sides, such as, e.g., the top side and the bottom side. The Rowclk signal and the GWEN signal may be used to generate the enn signal (which may be referred to as a control signal, an activation signal, and/or an enable signal). This may assist with tracking bitline delay and rising of the wordline (WL), which may further assist with avoiding various issues because of timing mismatch. The enn signal may be activated or enabled after the wordline (WL) is ON, and in some instances, the logic circuit may make sure that happens. Description related to the logic circuitry is described further herein below. As described herein, routing of the signals Rowclk, GWEN, and colm_mux_select (YW) may be passed through the logic circuit. Moreover, routing is not done over the core 204, which may assist with not limiting memory architecture having high bitline resistance issues.

Figure 3A:
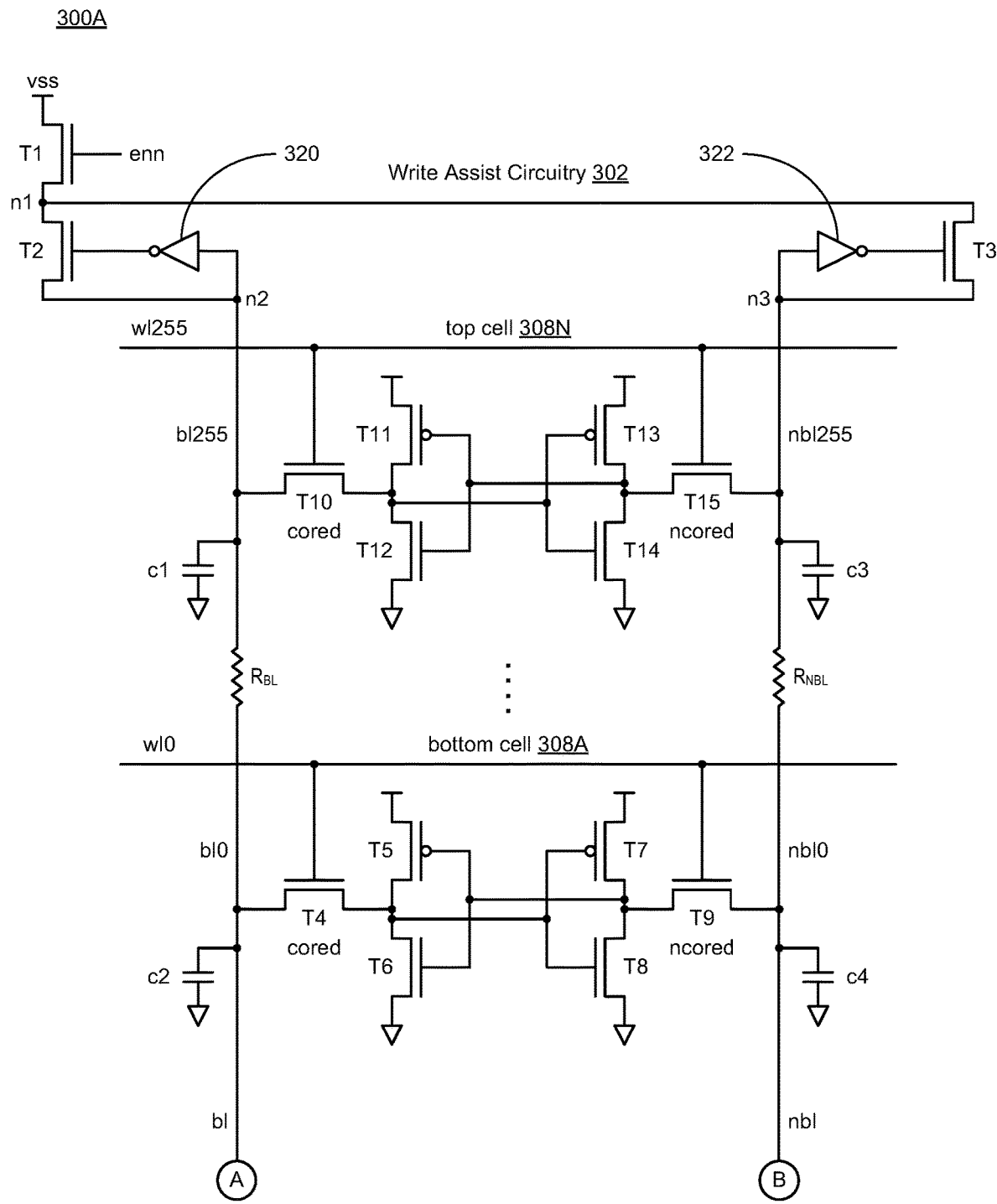
FIGS. 3A-3B illustrate a diagram of other memory circuitry in accordance with various implementations described herein.
Figure 3B:
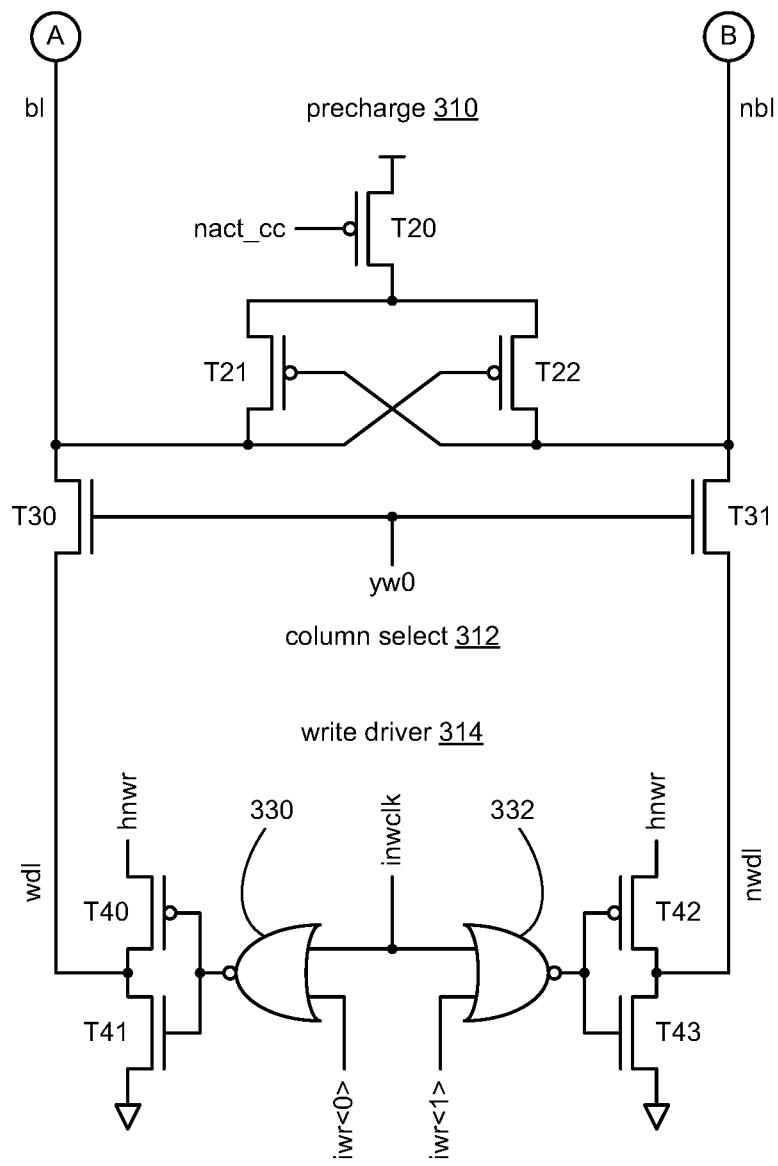

FIGS. 3A-3B illustrate a diagram of memory circuitry 300 in accordance with various implementations described herein.

As shown in FIGS. 3A-3B, the memory circuitry 300 may include write assist circuitry 302, memory cells 308A, . . . , 308N, a precharge circuit 310, a column selector 312, and a write driver 314. As shown, bitline circuitry (bl, nbl) in FIG. 3A is coupled to bitline circuitry (bl, nbl) in FIG. 3B at coupling nodes A, B.

In some implementations, the write assist circuitry 302 may include transistors T1, T2, T3 and inverters 320, 322 that are arranged to receive bitline signals from bitlines (bl, nbl) and receive the control signal (enn), which may be referred to as an activation signal or an enable signal. The bitlines (bl, nbl) may include a first bitline (bl) and a second bitline (nbl) that is complementary to the first bitline (bl).

Figure 4:
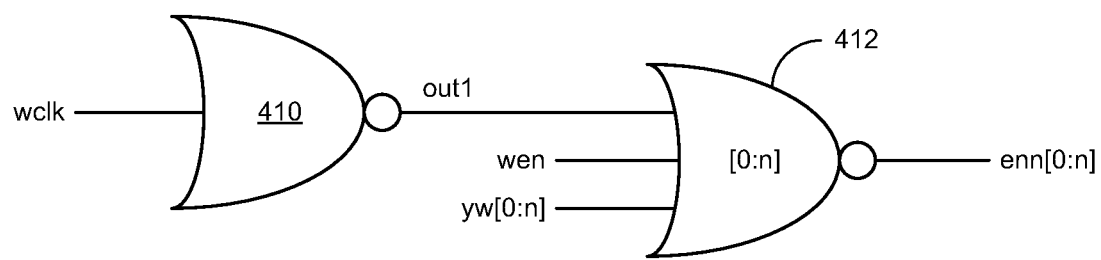
FIG. 4 illustrates a logic diagram of control signal (enn) generation circuitry in accordance with various implementations described herein.

In some implementations, when the bitline (bl, nbl) is being discharged by the write driver 314, the inverter 320, 322 may turn "ON" to thereby assist with discharging the bitline (bl) from both directions (i.e., top and bottom). For instance, while writing, the bitline (bl) must be discharged, and as such, the bitline (bl, nbl) may turn the inverter 320, 322 "ON" which may enable the write assist circuitry 302 to discharge the bitline (bl, nbl) so as to reduce write delay. As shown in FIG. 4 below, the enn control signal may be associated with the column selection signal (yw) to save power. Further, in some cases, some half-selected columns (e.g., wordline may be ON, but may not be read) may have the bitline (bl) discharged to Vss. To save power for some columns, the column selection signal (yw) may be provided as part of generating the enn signal (FIG. 4).

The transistors T1, T2, T3 may include a first transistor T1 that is coupled between a first node n1 and a ground source (vss). The transistors T1, T2, T3 may include a second transistor T2 that is coupled between the first transistor T1 at the first node n1 and the first bitline (bl) at a second node n2. The inverters 320, 322 may include a first inverter 320 having an input coupled to the second node n2 and an output coupled to a gate of the second transistor T2. The transistors T1, T2, T3 may include a third transistor T3 that is coupled between the first and second transistors T1, T2 at the first node n1 and the second bitline (nbl) at a third node n3. The inverters 320, 322 may include a second inverter 322 having an input coupled to the third node n3 and an output coupled to a gate of the third transistor T3.

The memory cells 308A, . . . , 308N may include a number of bitcells (bl0, . . . , bl255), such as, e.g., static RAM (SRAM) bitcells. In some instances, each of the bitcells 308A, . . . , 308N may include multiple transistors (bitcell 308A: bl0: T4-T9 and bitcell 308N: bl255: T10-T15) that are arranged as 6T bitcells, which may have access ports controlled by wordlines wl0, . . . , wl255. In various instances, the SRAM bitcells may be implemented with 5T bitcells, 4T 2R bitcells, or various other types of CMOS SRAM cells, such as, e.g., 8T, 10T or more transistors per bit. Further, multi-wordlines may result in multiple access ports into each of the bitcells. Since there are multiple access ports, multi-port access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in a left half array and a right half array.

The precharge circuit 310 may include multiple transistors T20-T22 that are arranged and coupled to the bitlines (bl, nbl) so as to precharge the bitlines (bl, nbl). The transistor T20 is coupled between a source voltage vdd and transistors T21, T22, and the transistor T20 is activated by with a gate signal (nact_cc). The transistors T21, T22 are cross-coupled between transistor T20 and the bitlines (bl, nbl).

The column selector 312 may include multiple transistors T30-T31 that are arranged and coupled to the bitlines (bl, nbl) so as to select the bitlines (bl, nbl) in a column (e.g., column 0) with column select signal (yw0). The column selector 312 may include other transistors that are arranged and coupled to other bitlines so as to select bitlines in any number (N) of columns with corresponding column select signals (ywN).

The write driver 314 may include multiple transistors T40, T41, T42, T43 and multiple logic devices (e.g., NOR gates 330, 332). As shown, transistors T40, T41 and NOR gate 330 are arranged to receive signals inwclk, iwr<0> and provide a wordline driver signal (wdl) to the column selector 312 via the first bitline (bl). Further, transistors T42, T43 and NOR gate 322 are arranged to receive signals inwclk, iwr<1> and provide a wordline driver signal (nwdl) to the column selector 312 via the second bitline (nbl).

In reference to the first bitline (bl), the resistance of the first bitline (bl) may be modelled with a first model resistor $R_{BL}$, and the farthest and nearest capacitance of the first bitline (bl) may be modelled with a first model capacitor C1 to represent a farthest capacitance that is proximate to farthest bitcell BCN and with a second model capacitor C2 to represent a nearest capacitance that is proximate to nearest bitcell BC0.

In reference to the second bitline (nbl), the resistance of the second bitline (nbl) may be modelled with a second model resistor $R_{NBL}$, and the farthest and nearest capacitance of the second bitline (nbl) may be modelled with a third model capacitor C3 to represent another farthest capacitance that is proximate to farthest bitcell BCN and with a fourth model capacitor C4 to represent another nearest capacitance that is proximate to nearest bitcell BC0.

FIG. 4 illustrates a diagram of control signal (enn) generation circuitry 400 in accordance with various implementations described herein. The circuitry 400 represents one implementation, and as such, various other implementations may be utilized in multiple ways to achieve similar operational results.

As shown in FIG. 4, the control signal (enn) generation circuitry 400 may include one or more logic gates, such as, e.g., multiple NOR gates 410, 412 that are arranged to receive multiple signals, such as, e.g., a write clock signal (WCLK), a write enable signal (WEN), and a column select signal (YW). Further, the control signal (enn) generation circuitry 300 generates and provides the control signal (enn) based on the multiple signals WCLK, WEN, YW[0:n].

The multiple NOR gates 410, 412 may include a first NOR gate 410 and a second NOR gate 412. The first NOR gate 410 receives the write clock signal (WCLK), generates an output signal (out1), and provides the output signal (out1) to the second NOR gate 412. The second NOR gate 412 receives multiple signals including the output signal (out1), the write enable signal (WEN), and the column select signal (YW[0:n]) and then generates the control signal (enn) as an output signal. In some instances, the control signal (enn) generation circuitry 400 may be provided for each column in the memory circuitry, wherein the memory circuitry includes a number (n) of columns.

Figure 5:
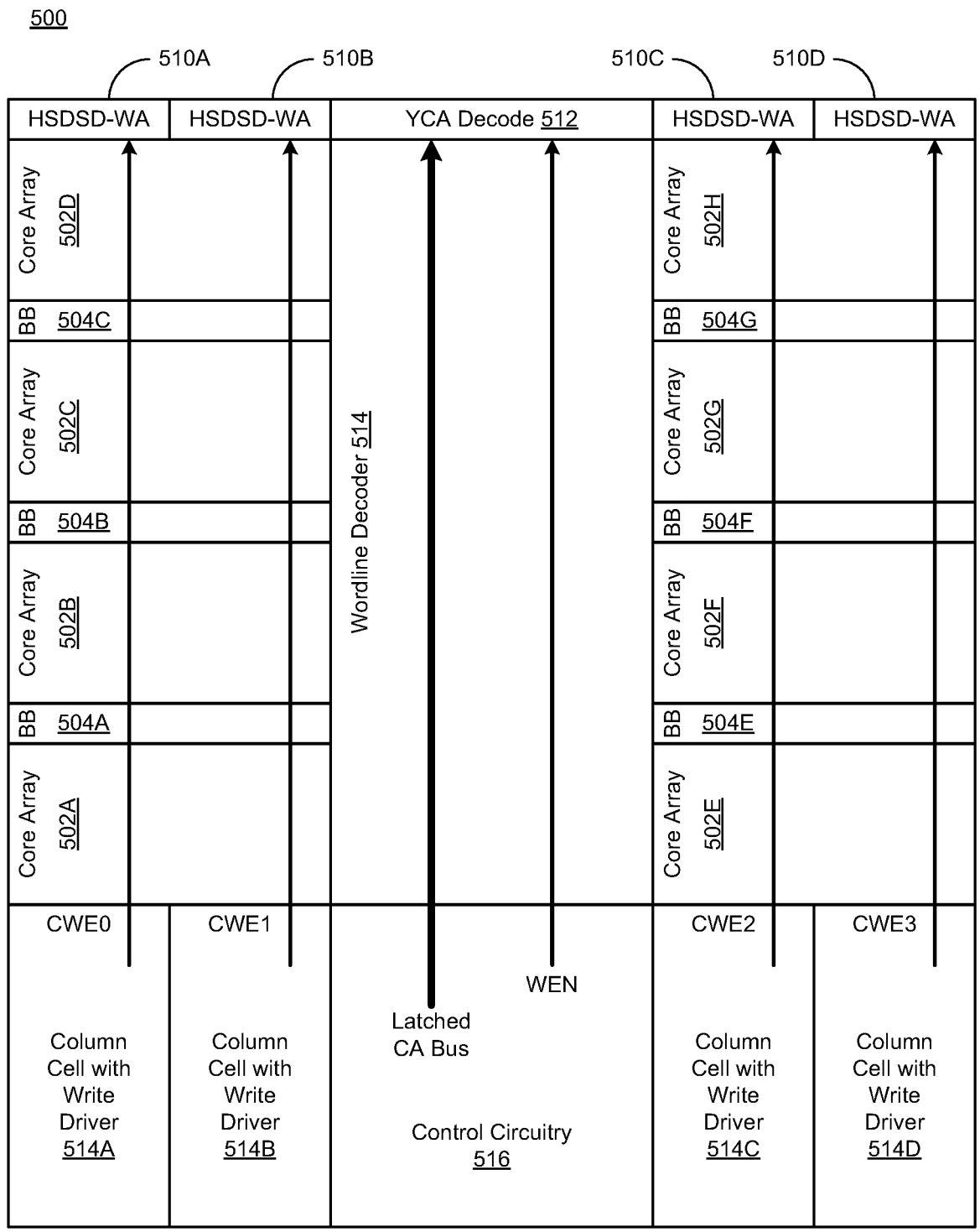
FIG. 5 illustrates a diagram of split driver memory circuitry in accordance with various implementations described herein.

FIG. 5 illustrates a diagram of split driver memory circuitry 500 in accordance with various implementations described herein.

As shown in FIG. 5, the split driver memory circuitry 500 may include a core array with multiple (left-side) core array banks 502A-502D and multiple (right-side) core array banks 502E-502H. As shown, the (left-side) banks 502A-502D may be separated by (left-side) banking breaks (BB) 504A-504C, and the (right-side) banks 502E-502H may be separated by (right-side) banking breaks (BB) 504E-504G.

In some instances, the split driver memory circuitry 500 may include multiple write assist drivers 510A-510D, column access decoder (YCA) 512, and wordline decoder 514. The write assist drivers 510A-510D may include high-speed differential split drivers with Write Assist (HSDSD-WA). The split driver memory circuitry 500 may include multiple column cells with write drivers 514A-514D and control circuitry 516. As shown, each column cell with write driver 514A-514D provides a corresponding column write enable signal (CWE0-CWE3) to a corresponding write assist driver 510A-510D. Further, the control circuitry 516 provides multiple signals, such as a write enable (WEN) signal and a latched column assist (CA) bus signal to the column access decoder (YCA) 512.

As described herein, conventional write circuitry typically involves a write driver at only one end of each bitline, which imposes a write-ability challenge in case of highly resistive bitlines. Therefore, some implementations described herein may use a split write driver architecture and a related scheme that uses write drivers at one end of each bitline and column selective differential write sensing drivers at the other end of each bitline so as to support write operations in a highly resistive bitline environment under low wordline pulse. Further, efficiency of conventional write drivers may saturate with bitline RC load due to self-loading as the write driver's size increases. However, the split write driver architecture provided herein may distribute the write driver's area and/or performance in an efficient manner so as to perform high speed write operations within a shorter wordline pulse, which may improve write yield of write operations.

Figure 6A:
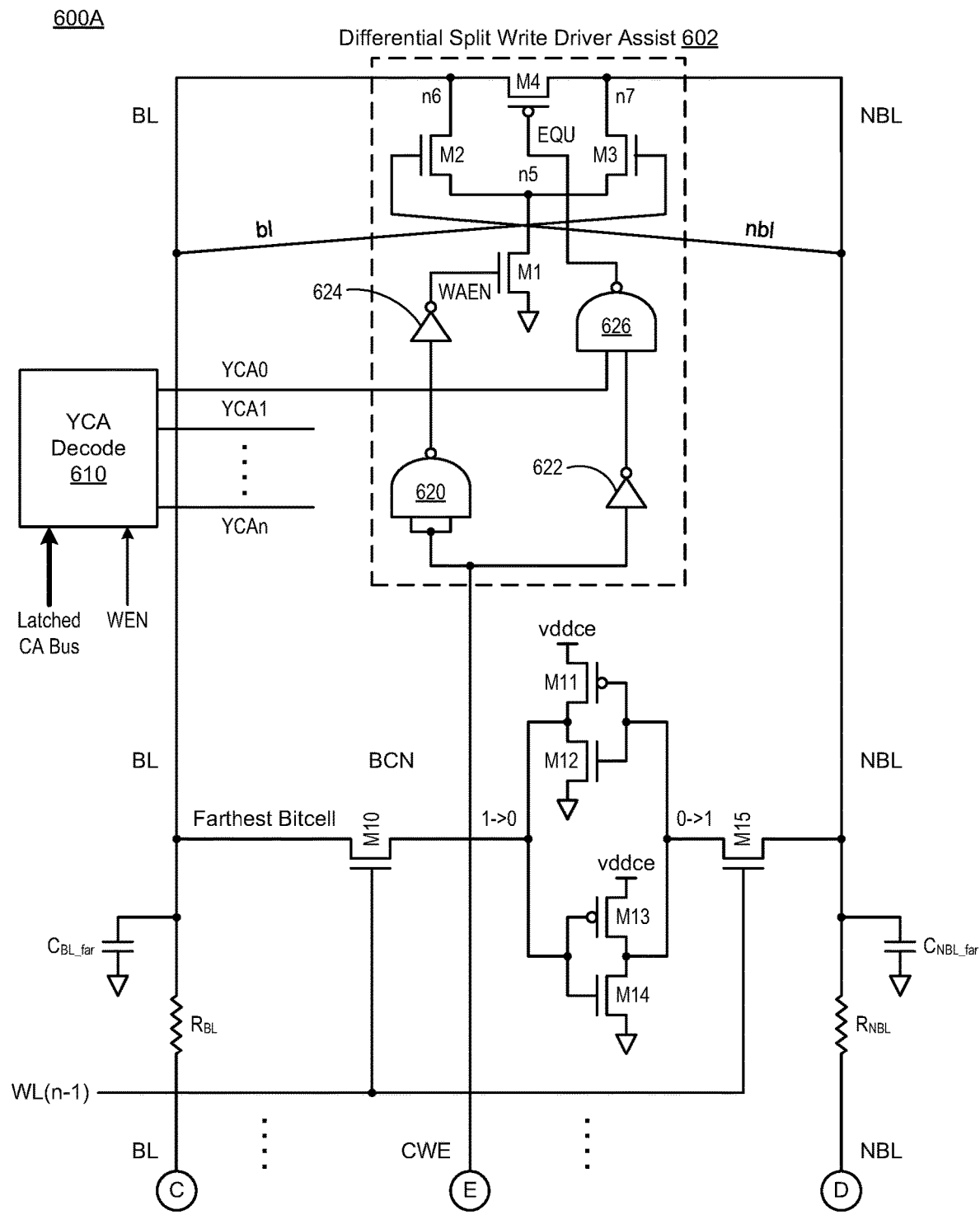
FIG. 6A-6B illustrate a diagram of other memory circuitry in accordance with various implementations described herein.
Figure 6B:
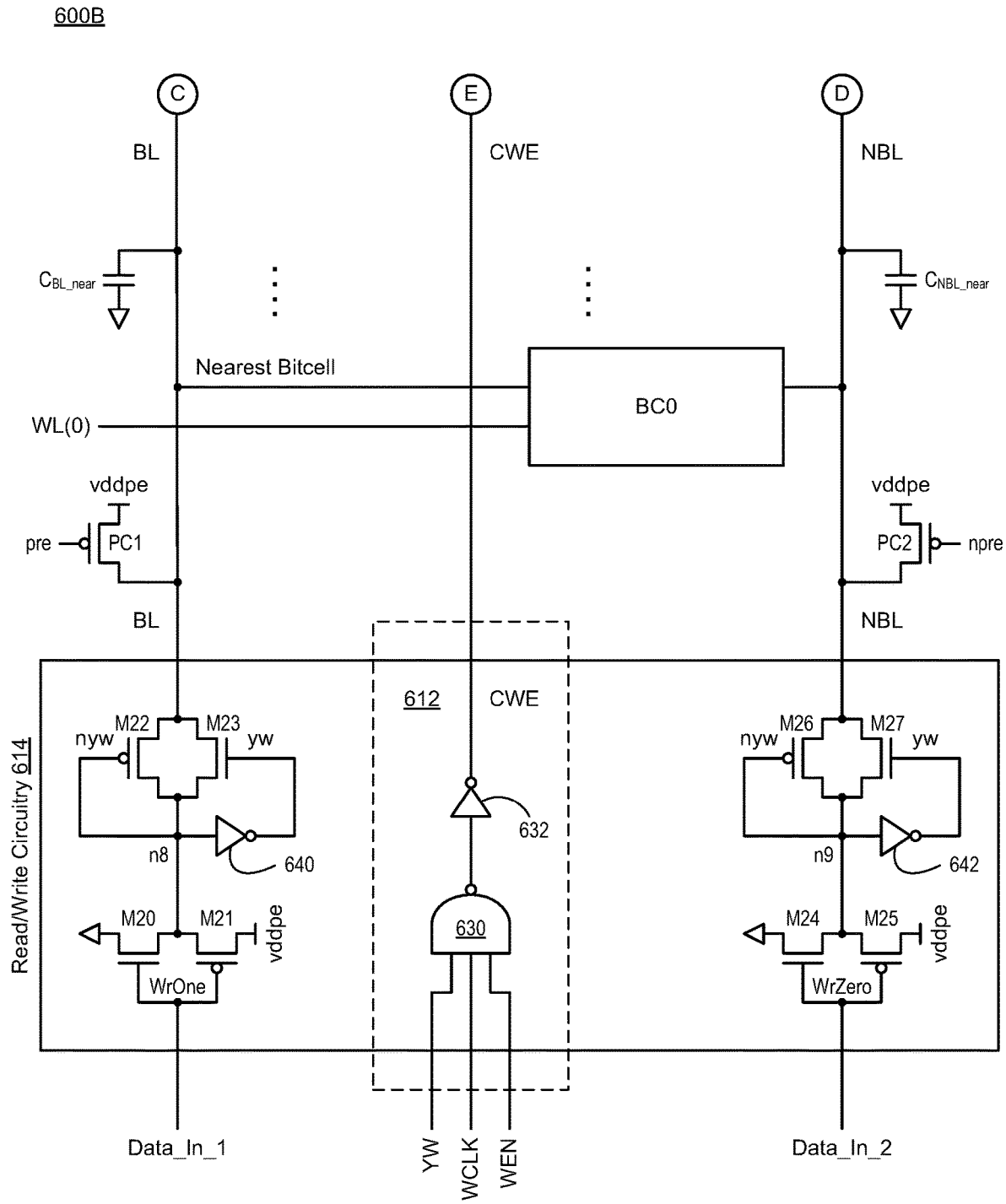

FIG. 6A-6B illustrate a diagram of memory circuitry 600 in accordance with various implementations described herein.

As shown in FIGS. 6A-6B, the memory circuitry 600 may include write assist circuitry 602, memory cells (or bitcells) BC0, . . . , BCN, precharge transistors PC1-PC2, column decoder circuitry (YCA) 610, column selector circuitry 612, and read-write driver circuitry 614. Bitline circuitry (BL, NBL) in FIG. 6A is coupled to bitline circuitry (BL, NBL) in FIG. 3B at coupling nodes C, D, E. The bitline circuitry (BL, NBL) includes a first bitline BL and a second bitline NBL that is complementary to the first bitline BL. The memory circuitry 600 may be provided for each column in memory array circuitry, wherein the memory array circuitry includes a number (n) of columns. In some implementations, the write assist circuitry 602 may include differential split write driver assist circuitry, such as, e.g., high-speed differential split drivers with write assist (HSDSD-WA) circuitry.

The write assist circuitry 602 may include multiple logic gates 620, 622, 624, 626 and multiple transistors M1, M2, M3, M4 that are coupled together and arranged to receive a column write enable (CWE) signal and drive write operations for the memory cells (bitcells) BC0, . . . , BCN in the array of memory cells (or bitcells). As shown, each of the memory cells may include multiple transistors that are arranged as bitcell, such as, e.g., static RAM (SRAM) bitcells. In some instances, each of the bitcells BCO0, . . . , BCN may include multiple transistors (bitcell BCN: M10-M15) that are arranged as 6T bitcells, which may have access ports controlled by wordlines wl0, . . . , wl255. For instance, a farthest bitcell BCN may include transistors M10-M15 that are arranged as a 6T bitcell, which may have access ports controlled by wordlines WL(n-1). In various instances, the SRAM bitcells may be implemented with 5T bitcells, 4T 2R bitcells, or various other types of CMOS SRAM cells, such as, e.g., 8T, 10T or more transistors per bit.

In some implementations, the multiple logic gates 620, 622, 624, 626 may include a first NAND gate 620, a first inverter 622, a second inverter 624, and a second NAND gate 626. As shown, the first NAND gate 620 may receive the column write enable (CWE) signal and provide an output signal to the second inverter 624, and the second inverter 624 may generate a write assist enable (WAEN) signal. The first inverter 622 may receive the column write enable (CWE) signal and provide an output signal to the second NAND gate 626, and the second NAND gate 626 may generate a equalizer signal (EQU). Further, the multiple transistors M1, M2, M3, M4 may include a first transistor M1, a second transistor M2, a third transistor M3, and a fourth transistor M4. As shown, the first transistor M1 is coupled between node n5 and a ground source (Vss, GND), and the first transistor M1 is activated based on the write assist enable (WAEN) signal. The second transistor M2 is coupled between the first bitline BL at node n6 and node n5, and the second transistor M2 is activated based on a second bitline signal (nbl) from the second bitline (NBL). The third transistor M3 is coupled between the second bitline NBL at node n7 and node n5, and the third transistor M3 is activated based on a first bitline signal (bl) from the first bitline (BL). The fourth transistor M4 is coupled between the second transistor M2 at node n6 and the third transistor M3 at node n7, and the fourth transistor M4 is activated based on the equalizer signal (EQU).

In some instances, the WAEN signal may be enabled after the YW, WCLK and WEN are enabled. The fourth transistor M4 may be referred to as an equalizer transistor M4 that may be enabled once the early column decoded YCA signal (e.g., YCA0) is triggered and then disabled before the WAEN driver NMOS M1 is enabled. In this instance, differential data is sensed in the right direction once the differential write driver circuitry 614 is enabled.

The column decoder (YCA) circuitry 610 may receive the write enable (WEN) signal and a latched column assist (CA) bus signal, and the YCA circuitry 610 may decode the WEN, CA signals and output at least one decoded signal (YCA0, YCA1, . . . , YCAn) to the second NAND gate 626 of a selected column.

The precharge transistors PC1-PC2 may be coupled to the bitlines (BL, NBL) for precharging the bitlines to a precharge voltage level, such as, e.g., a periphery source voltage (vddpe). For instance, a first precharge transistor PC1 may be coupled between the periphery source voltage (vddpe) and the first bitline BL, and the first precharge transistor PC1 may be activated based on a first precharge control signal (pre). Further, a second precharge transistor PC2 may be coupled between the periphery source voltage (vddpe) and the second bitline NBL, and the second precharge transistor PC2 may be activated based on a second precharge control signal (npre).

The column selector circuitry 612 may include one or more logic gates including a first logic gate 630, such as, e.g., a NAND gate, and a second logic gate 632, such as, e.g., an inverter. The first logic gate 630 (e.g., NAND gate) may receive multiple signals such as, e.g., the column select signal (YW), the write clock signal (WCLK), and the write enable signal (WEN). The first logic gate 630 (e.g., NAND gate) may generate an output signal based on the signals YW, WCLK, WEN and then provide the output signal to the second logic gate (e.g., inverter). The second logic gate 632 (e.g., inverter) may receive the output signal from the first logic gate 620 (e.g., NAND gate) and then generate and provide the column write enable (CWE) signal.

In some instances, the read-write driver circuitry 614 may include multiple transistors M20, M21 that are coupled in series between the periphery voltage source (vddpe) and ground (vss, gnd). The transistors M20, M21 may be coupled together as an inverter so as to receive a first data input signal (Data_In_1) associated with a write logic one signal (WrOne) for activating the transistors M20, M21. The transistors M20, M21 may provide an output signal (nyw) at node n8. The read-write driver circuitry 614 may include multiple transistors M22, M23 and an inverter 640 coupled together in parallel and arranged to receive the output signal (nyw) at node n8 and provide another output signal as the first bitline signal (bl) to the first bitline BL. As shown, transistor M22 may be activated with the signal (nyw), and transistor M23 may be activated based on a signal (yw) that is provided by the inverter 640.

Further, the read-write driver circuitry 614 may include multiple transistors M24, M25 that are coupled in series between the periphery voltage source (vddpe) and ground (vss, gnd). The transistors M24, M25 may be coupled together as an inverter so as to receive a second data input signal (Data_In_2) associated with a write logic zero signal (WrZero) for activating the transistors M24, M25. The transistors M24, M25 may provide an output signal (nyw) at node n9. The read-write driver circuitry 614 may include multiple transistors M26, M27 and an inverter 642 coupled together in parallel and arranged to receive the output signal (nyw) at node n9 and provide another output signal as the second bitline signal (nbl) to the second bitline NBL. As shown, transistor M24 may be activated with the signal (nyw), and transistor M25 may be activated based on a signal (yw) that is provided by the inverter 642.

In reference to the first bitline BL, the resistance of the first bitline BL may be modelled with a first model resistor $R_{BL}$, and the farthest and nearest capacitance of the first bitline BL may be modelled with a first model capacitor $C_{BL\_far}$ to represent a farthest capacitance that is proximate to farthest bitcell BCN and with a second model capacitor $C_{BL\_near}$ to represent a nearest capacitance that is proximate to nearest bitcell BC0.

In reference to the second bitline NBL, the resistance of the second bitline NBL may be modelled with a second model resistor $R_{NBL}$, and the farthest and nearest capacitance of the second bitline NBL may be modelled with a third model capacitor $C_{NBL\_far}$ to represent another farthest capacitance that is proximate to farthest bitcell BCN and with a fourth model capacitor $C_{NBL\_near}$ to represent another nearest capacitance that is proximate to nearest bitcell BC0.

In some implementations, as shown in FIG. 6A, the write assist circuitry 602 utilizes the cross-coupled differential NMOS assist scheme. The write assist circuitry 602 may sense write data through the bitlines (BL, NBL) from external data driven by the read-write circuitry 614, which is disposed at the bottom to perform write operations. The cross-coupled NMOS transistors M2, M3 are activated through a driver NMOS M1 controlled by the signal WAEN. The WAEN signal may activate the driver NMOS M1 when the column select (YW) signal, the write clock (WCLK) signal, and the write enable (WEN) signal are enabled. The write assist circuitry 602 uses PMOS transistor M4 to assist with equalizing the bitlines before enabling the read-write driver circuitry 614 at the bottom and enabling the write assist circuitry 602 at the top, which is enabled with the WAEN signal. The EQU signal enables the equalizer PMOS M4 based on the column decoded (YCA) signal (which is latched by the column address signal (CA) for that column where the write is happening) so that on unselected columns, the equalizers M4 may be turned off all the time. Further, in some cases, the WEN signal may be used to turn off the equalization operations on the columns. In other cases, the equalizers M4 may be enabled on selected columns, which may then be disabled when the YW, WCLK and WEN signals are enabled for write operations. Thus, the equalizers M4 may improve efficiency of differential sensing.

In some implementations, the WAEN signal may ensure that differential write assist is enabled after written data is loaded on the bitlines (BL, NBL). Sizing of the split driver may need to be taken care as the size should be between the strength of the write driver and the bitcell. This may ensure that enough assist is available even under variation without having to fight against the write driver disposed at the bottom. In some instances related to high performance and high write yield, some implementations described herein may assist with reducing high bitline RC impact of high bitline resistance. Further, high performance corners may be highly impacted under high metal RC, which may result in smaller pulse widths due to faster devices. This may result in a smaller write window where write operations may fail. However, some implementations described herein solve this problem without any pulse width increase and without area impact.

Described herein are various implementations of an integrated circuit. The integrated circuit may include memory circuitry having an array of bitcells. The integrated circuit may include read-write circuitry coupled to the memory circuitry to perform read operations and write operations for the array of bitcells. The integrated circuit may include write assist circuitry coupled to the memory circuitry and the read-write circuitry. The write assist circuitry may receive a control signal from the read-write circuitry. The write assist circuitry may sense write operations based on the control signal and may drive the write operations for the array of bitcells.

Described herein are various implementations of an integrated circuit. The integrated circuit may include memory circuitry having an array of bitcells. The integrated circuit may include read-write circuitry coupled to the memory circuitry to perform read operations and write operations for the array of bitcells. The read-write circuitry may include a logic circuit that receives multiple input signals and provides a control signal based on the multiple input signals. The integrated circuit may include write assist circuitry coupled to the memory circuitry and the read-write circuitry. The write assist circuitry may receive the control signal from the read-write circuitry. The write assist circuitry may sense write operations based on the control signal and may drive the write operations for the array of bitcells.

Described herein are various implementations of an integrated circuit. The integrated circuit may include memory circuitry having an array of bitcells. The integrated circuit may include read-write circuitry coupled to the memory circuitry to perform read operations and write operations for the array of bitcells. The read-write circuitry may receive multiple input signals and may provide a control signal based on the multiple input signals. The integrated circuit may include differential split write driver assist circuitry coupled to the memory circuitry and the read-write circuitry. The differential split write driver assist circuitry may include one or more circuit components that are arranged to receive the control signal from the read-write circuitry, sense the write operations based on the control signal, and drive the write operations for the array of bitcells.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   memory circuitry having an array of bitcells;
   read-write circuitry coupled to the memory circuitry to perform read operations and write operations for the array of bitcells; and
   write assist circuitry, comprising a plurality of transistors and a plurality of inverters, coupled to the memory circuitry and the read-write circuitry, wherein:
      the write assist circuitry receives a control signal from the read-write circuitry;
      the write assist circuitry senses write operations based on the control signal and drives the write operations for the array of bitcells, wherein the control signal is generated based on a write clock signal to prevent timing mismatch;
      the read-write circuitry drives the write operations via multiple bitlines from a first direction, and the write assist circuitry drives the write operations via the multiple bitlines from a second direction that is different than the first direction; and
      an operational combination of the read-write circuitry and the write assist circuitry is configured to discharge the multiple bitlines in the first direction and the second direction when at least one of the plurality of inverters is turned on.

2. The integrated circuit of claim 1, wherein the read-write circuitry receives a data input signal and performs the read operations and the write operations for the array of bitcells based on the data input signal.

3. The integrated circuit of claim 1, wherein the read-write circuitry is coupled to the memory circuitry via the multiple bitlines, and wherein the read-write circuitry is coupled to the memory circuitry via the multiple bitlines so as to perform the read operations and the write operations for the array of bitcells via the multiple bitlines, and wherein the write assist circuitry is coupled to the memory circuitry via the multiple bitlines so as to drive the write operations for the array of bitcells via the multiple bitlines.

4. The integrated circuit of claim 1, wherein the operational combination of the read-write circuitry and the write assist circuitry provides for discharging the multiple bitlines in the first direction and the second direction so as to reduce resistance-capacitance delay on the multiple bitlines during the write operations.

5. The integrated circuit of claim 1, wherein the read-write circuitry comprises a logic circuit that receives multiple input signals and provides the control signal based on the multiple input signals.

6. The integrated circuit of claim 5, wherein the logic circuit comprises multiple logic gates that are arranged to receive the multiple input signals including a column select signal, the write clock signal, and a write enable signal and provide the control signal based on the multiple input signals, and
   wherein the control signal activates the write assist circuitry when the column select signal, the write clock signal, and the write enable signal are enabled.

7. The integrated circuit of claim 1, wherein the plurality of transistors are arranged to receive the control signal and drive the write operations for the array of bitcells by discharging the multiple bitlines, and wherein the plurality of inverters are turned on by the multiple bitlines.

8. The integrated circuit of claim 7, wherein the plurality of transistors include a first transistor and a second transistor and the plurality of inverters include a first inverter and a second inverter, wherein a gate of the first transistor is connected to its source through the first inverter and a gate of the second transistor is connected to its source through the second inverter.

9. The integrated circuit of claim 1, wherein the plurality of transistors comprise cross-coupled differential transistors that are arranged to sense the write operations based on the control signal.

10. An integrated circuit, comprising:
    memory circuitry having an array of bitcells;
    read-write circuitry coupled to the memory circuitry to perform read operations and write operations for the array of bitcells, wherein the read-write circuitry comprises a logic circuit that receives multiple input signals and provides a control signal based on the multiple input signals; and
    write assist circuitry, comprising a plurality of transistors and a plurality of inverters, coupled to the memory circuitry and the read-write circuitry, wherein:
       the write assist circuitry receives the control signal from the read-write circuitry;
       the write assist circuitry senses write operations based on the control signal and drives the write operations for the array of bitcells, wherein the control signal is generated based on a write clock signal to prevent timing mismatch;
       the read-write circuitry drives the write operations via multiple bitlines from a first direction, and the write assist circuitry drives the write operations via the multiple bitlines from a second direction that is different than the first direction; and
       an operational combination of the read-write circuitry and the write assist circuitry is configured to discharge the multiple bitlines in the first direction and the second direction when at least one of the plurality of inverters are turned on by at least one of the multiple bitlines.

11. The integrated circuit of claim 10, wherein the read-write circuitry receives a data input signal and performs the read operations and the write operations for the array of bitcells based on the data input signal.

12. The integrated circuit of claim 10, wherein the read-write circuitry is coupled to the memory circuitry via the multiple bitlines, and wherein the read-write circuitry is coupled to the memory circuitry via the multiple bitlines so as to perform the read operations and the write operations for the array of bitcells via the multiple bitlines, and wherein the write assist circuitry is coupled to the memory circuitry via the multiple bitlines so as to drive the write operations for the array of bitcells via the multiple bitlines.

13. The integrated circuit of claim 10, wherein the operational combination of the read-write circuitry and the write assist circuitry provides for discharging the multiple bitlines in the first direction and the second direction so as to reduce resistance-capacitance delay on the multiple bitlines during the write operations.

14. The integrated circuit of claim 10, wherein the logic circuit comprises multiple logic gates that are arranged to receive the multiple input signals including a column select signal, a write clock signal, and a write enable signal and provide the control signal based on the multiple input signals.

15. The integrated circuit of claim 10, wherein the plurality of transistors are arranged to receive the control signal and drive the write operations for the array of bitcells by discharging the multiple bitlines.

16. An integrated circuit, comprising:
  memory circuitry having an array of bitcells;
  read-write circuitry coupled to the memory circuitry to perform read operations and write operations for the array of bitcells, wherein the read-write circuitry receives multiple input signals and provides a control signal based on the multiple input signals; and
  differential split write driver assist circuitry coupled to the memory circuitry and the read-write circuitry, wherein:
    the differential split write driver assist circuitry comprises a plurality of transistors that are arranged to receive the control signal from the read-write circuitry, sense the write operations based on the control signal, and drive the write operations for the array of bitcells;
    the read-write circuitry is configured to drive the write operations via multiple bitlines from a first direction, and the differential split write driver assist circuitry is configured to drive the write operations via the multiple bitlines from a second direction that is different than the first direction; and
    the differential split write driver assist circuitry further comprises an equalizer circuit to equalize the multiple bitlines based on the control signal,
    wherein two of the plurality of transistors are cross-coupled and a third transistor of the plurality of transistors is positioned in between to control the connection of the two transistors.

17. The integrated circuit of claim 16, wherein the one or more circuit components comprise one or more logic gates that are arranged to receive the control signal, sense the write operations based on the control signal, and drive the write operations for the array of bitcells, and wherein the third transistor is controlled by an equalizer signal from the equalizer circuit.

18. The integrated circuit of claim 17, wherein the two of the plurality of transistors comprise cross-coupled differential transistors that are arranged to sense the write operations based on the control signal, and wherein the two of the plurality of transistors are coupled to a ground source through a fourth transistor.

19. The integrated circuit of claim 1, wherein the operational combination of the read-write circuitry and the write assist circuitry is configured to discharge the multiple bitlines to a ground source.

20. The integrated circuit of claim 1, further comprises an equalizer circuit to equalize the multiple bitlines based on the control signal.

* * * * *